(12) United States Patent
Pua et al.

(10) Patent No.: US 6,490,163 B1
(45) Date of Patent: Dec. 3, 2002

(54) COMPUTER READABLE PORTABLE DATA STORAGE DEVICE

(75) Inventors: Khein-Seng Pua, Hsinchu; Chien An Chen, Taipei; Yu-Fong Lin, Taoyuan; Chee-Kong Awyong, Hsinchu, all of (TW)

(73) Assignee: Phison Electronic Corp., Hsinchu (TW)

( * ) Notice: Subject to any disclaimer, the term of this patent is extended or adjusted under 35 U.S.C. 154(b) by 64 days.

(21) Appl. No.: 09/941,714

(22) Filed: Aug. 30, 2001

(51) Int. Cl.[7] .................................................. H05K 1/14
(52) U.S. Cl. ........................ 361/737; 361/732; 361/784; 361/803; 174/250; 174/255; 439/165; 439/31; 439/173
(58) Field of Search ................................ 361/737, 684, 361/735, 755, 768, 785, 790, 732, 784, 736, 801, 803, 807–810; 439/640, 165, 173, 31; 174/250, 255; 710/103, 300–304

(56) References Cited

U.S. PATENT DOCUMENTS

| | | | | |
|---|---|---|---|---|
| 5,452,180 A | * | 9/1995 | Register et al. ............. | 361/686 |
| 5,855,489 A | * | 1/1999 | Walker ........................ | 439/342 |
| 6,050,990 A | * | 4/2000 | Tankovich et al. ............ | 606/16 |
| 6,166,723 A | * | 12/2000 | Schena et al. ............... | 345/157 |
| 6,354,861 B2 | * | 3/2002 | Schmitt et al. ............. | 439/376 |

* cited by examiner

*Primary Examiner*—David Martin
*Assistant Examiner*—Hung Bui
(74) *Attorney, Agent, or Firm*—Robert E. Bushnell, Esq.

(57) ABSTRACT

A portable data storage device includes a main circuit board, a stack of memory circuit boards mounted on the main circuit board, and a USB port pivoted to one end of the main circuit board and adapted to electrically connect the main circuit board to, for example, the USB port of a personal computer at one of a series of angular positions.

6 Claims, 7 Drawing Sheets

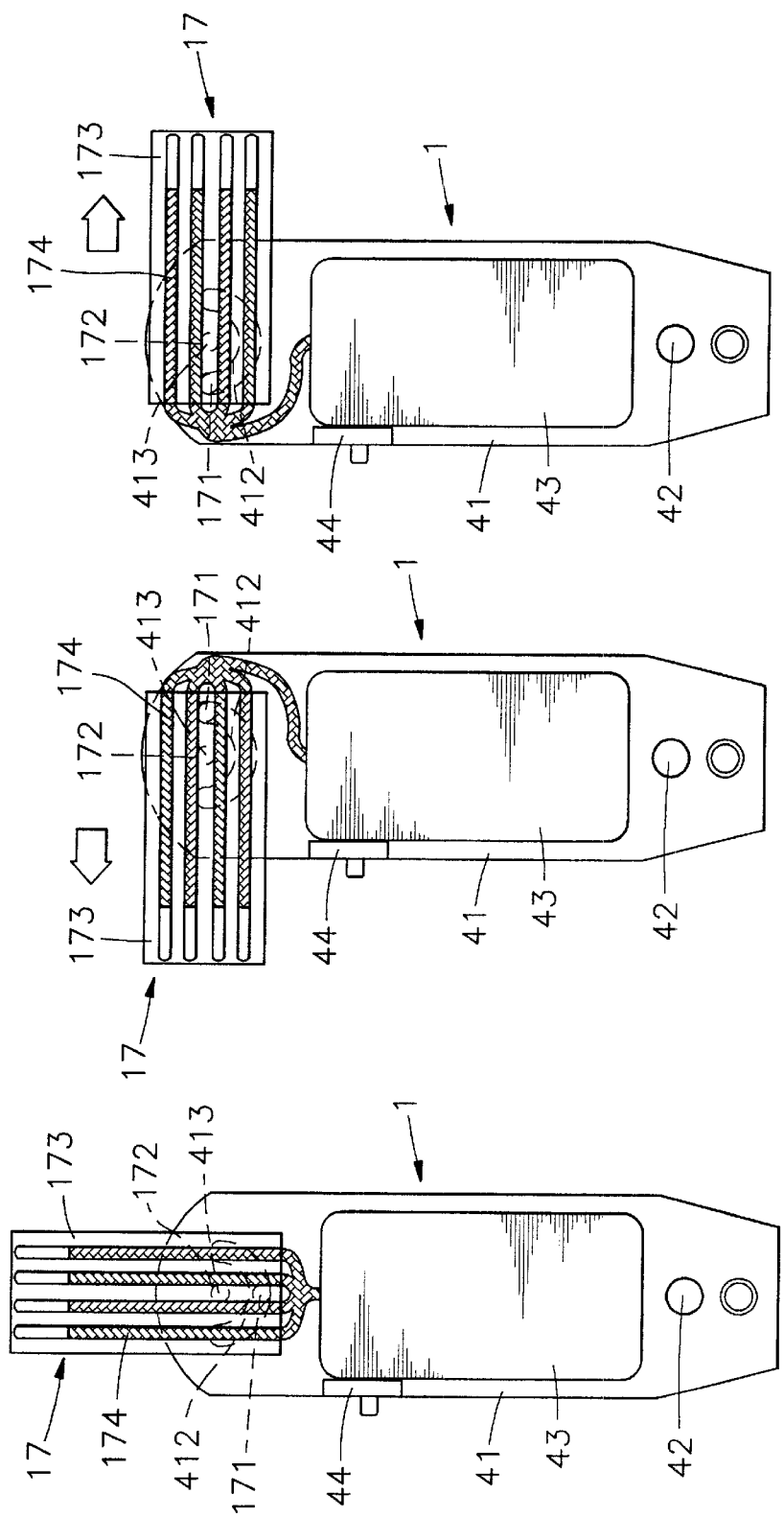

COMPUTER READABLE PORTABLE DATA STORAGE DEVICE

BACKGROUND OF THE INVENTION

The present invention relates to a portable data storage device and, more particularly, to a computer readable portable data storage device, which is comprised of a main circuit board, a memory circuit board coupled to the main circuit board, and a USB (universal serial bus) port pivoted to the main circuit board and adapted to electrically connected the main circuit board to the USB port of a personal computer.

A regular portable data storage device is readable to a computer, and can be connected to the USB port of a personal computer for enabling the user to transmit data between the personal computer and the portable data storage device. When connecting a portable data storage device to the USB port of a personal computer, the major part of the portable data storage device perpendicularly protrudes over the outside wall of the housing of the personal computer at a distance, and the protruded part of the portable data storage device tends to be impacted accidentally, causing a short circuit or a damage to the circuit.

SUMMARY OF THE INVENTION

The present invention has been accomplished to provide a computer readable portable data storage device, which eliminates the aforesaid problem. It is the main object of the present invention to provide a computer readable portable data storage device, which can be turned to an angular position close to the outside wall of the housing of the computer after its installation in the USB port of the computer, preventing an impact accident. According to the present invention, the computer readable portable data storage device comprises a main circuit board, a memory circuit board coupled to the main circuit board, and a USB (universal serial bus) port pivoted to the main circuit board and adapted to electrically connected the main circuit board to the USB port of a personal computer. The USB port of the computer readable portable data storage device can be turned relative to the main circuit board within a limited angle so that the main circuit board can be set in position close to the housing of the computer after connection of the USB port of the computer readable portable data storage device to the USB port of the computer.

BRIEF DESCRIPTION OF THE DRAWINGS

FIG. 6 shows the serial bus port and the main circuit board longitudinally aligned according to the present invention.

FIG. 7 shows the serial bus port turned 90° leftwards relative to the main circuit board according to the present invention.

FIG. 8 shows the serial bus port turned 90° rightwards relative to the main circuit board according to the present invention.

DETAILED DESCRIPTION OF THE PREFERRED EMBODIMENT

Figure 1:
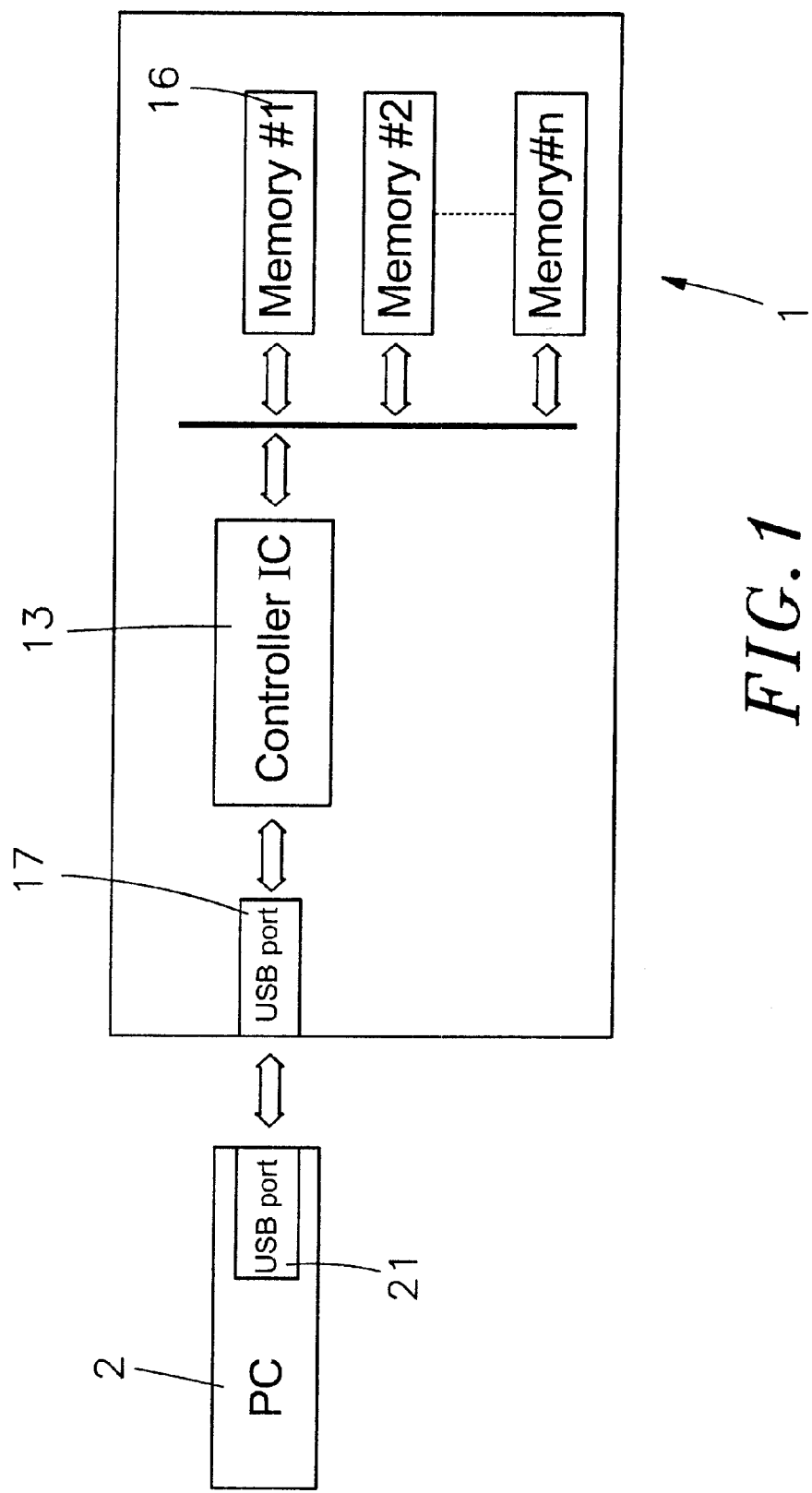
FIG. 1 is circuit block diagram showing the connection between a portable data storage device and a computer according to the present invention.
Figure 2:
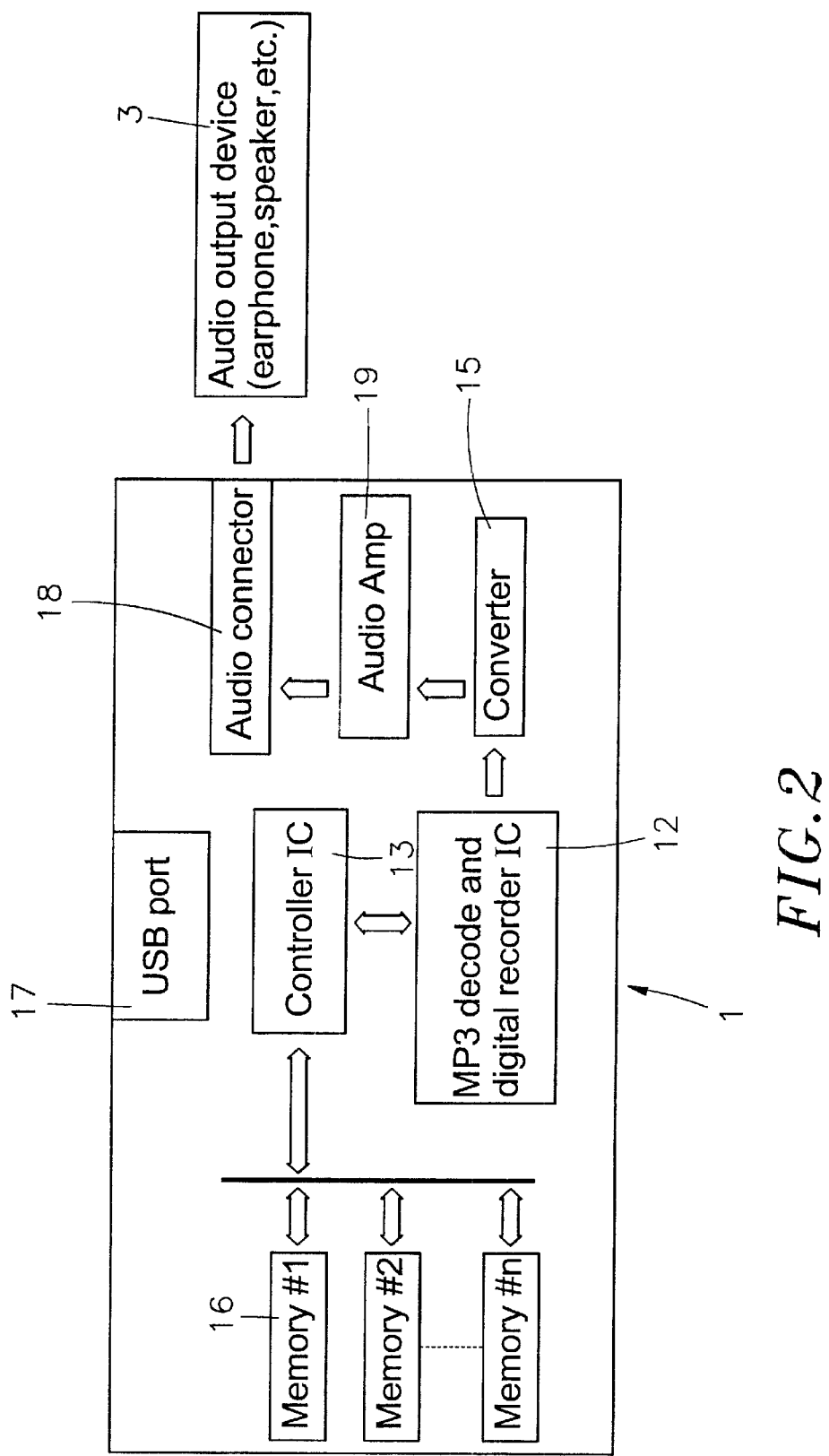
FIG. 2 is a circuit block diagram showing audio output action of the present invention.

Referring to FIGS. 1 and 2, a portable data storage device in accordance with the present invention comprises a body 1. The body 1 has a control circuit mounted on the inside, which is comprised of a MP3 decode and digital recorder IC 12, a controller IC 13, a converter 15, a plurality of memories 16, a serial bus port 17, and an audio connector 18. The serial bus port 17 can be connected to the USB port 21 of a computer 2, for interconnection between the controller IC 13 and the CPU (central processing unit) of the computer 2. After connection of the serial bus port 17 to the USB port 21 of the computer 2, the CPU of the computer 2 can be controlled to give a signal through a USB interface to the controller IC 13 of the body 1, commanding the controller IC 13 to fetch MP3 data from the memories 16, or to transfer data from the computer 2 to the memories 16.

Referring to FIG. 2 again, the body 1 further comprises an audio amplifier 19 connected between the converter 15 and the audio connector 18. An audio output device 3, for example, an earphone or speaker is connected to the audio connector 18 for audio output. If the body 1 is not connected to the computer 2, the user can operate the portable data storage to drive the controller IC 13 to fetch voice data (for example, REC file) from the memories 16 and then to transfer the fetched voice data to the MP3 decode and digital recorder IC 12 for decoding. Decoded voice data is then sent to the converter 15 and converted from digital signal to analog signal. Converted analog signal is then amplified through the audio amplifier 19, and then sent through the audio connector 18 to an external audio output device 3 for output.

Figure 3:
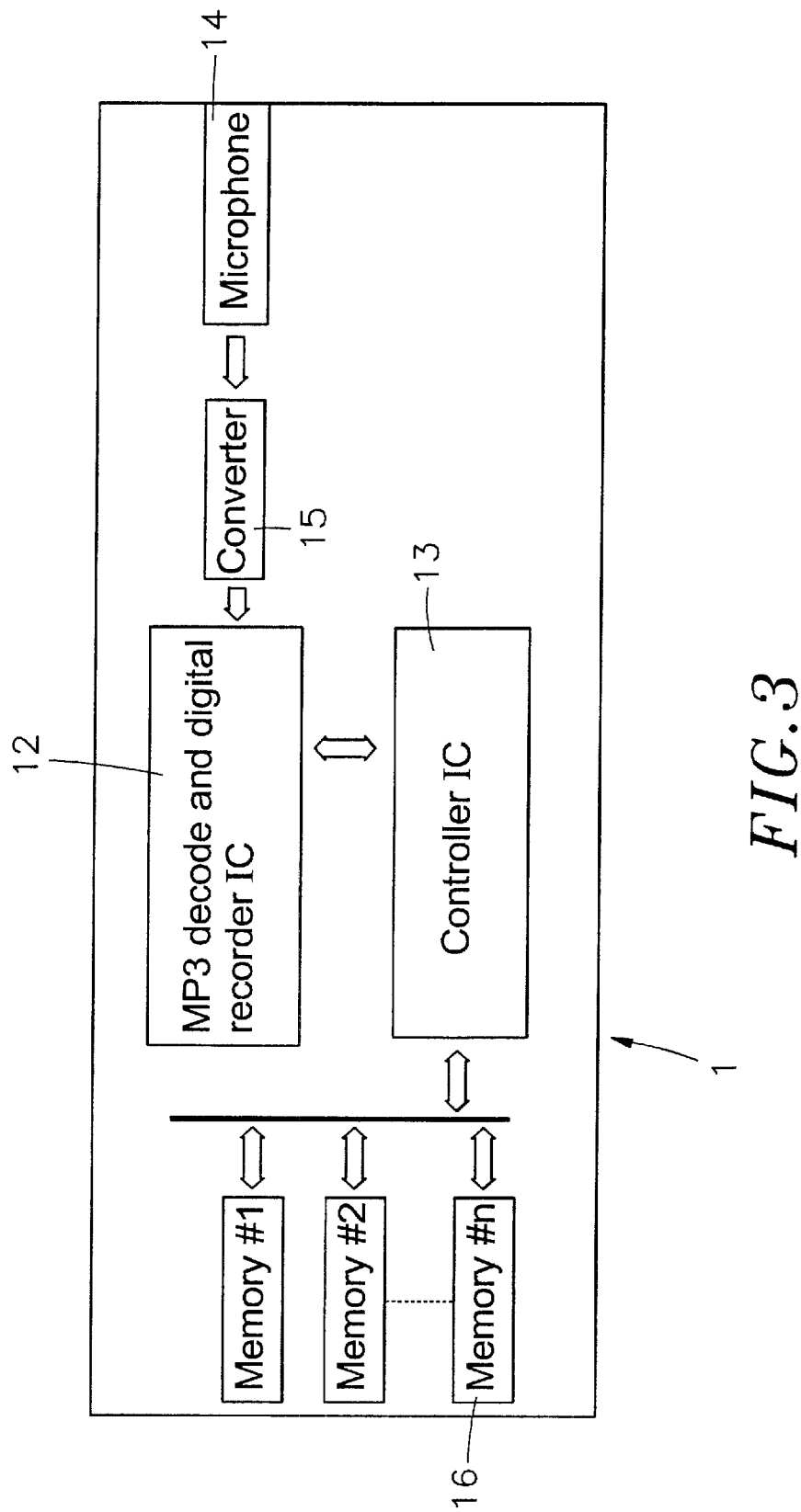
FIG. 3 is a circuit block diagram showing recording action of the present invention.

Referring to FIG. 3, the body 1 further comprises a microphone 14 adapted to pick up voice. If the body 1 is not connected to the computer 2, the user can operate the portable data storage device to drive the controller IC 13 to record d voice data. In this case, the microphone 14 picks up the voice, enabling the voice to be converted from analog signal to digital signal by the converter 15. The digital signal thus obtained is then sent from the converter 15 to the MP3 decode and digital recorder IC 12 for encoding. The encoded digital audio signal is then stored in the memories 16 by the controller IC 13.

Referring to FIGS. from 4 through 8, the main circuit board, referenced by 41, comprises an upright pivot rod 413 disposed near one end thereof, a smoothly arched sliding slot 412 spaced around the upright pivot rod 413. The serial bus port 17 comprises a bottom guide rod 171 and a through hole 172 corresponding to the smoothly arched sliding slot 412 and the upright pivot rod 413. The upright pivot rod 413 is coupled to the through hole 172 of the serial bus port 17 for enabling the serial bus port 17 to be turned about the upright pivot rod 413. The bottom guide rod 171 of the serial bus port 17 is inserted into the smoothly arched sliding slot 412 and moved with the USB port 17 relative to the main circuit board 41 to limit swivel motion of the serial bus port 17 relative to the main circuit board 41 to 90° leftwards or 90° rightwards (see FIGS. 6, 7, and 8).

Figure 4:
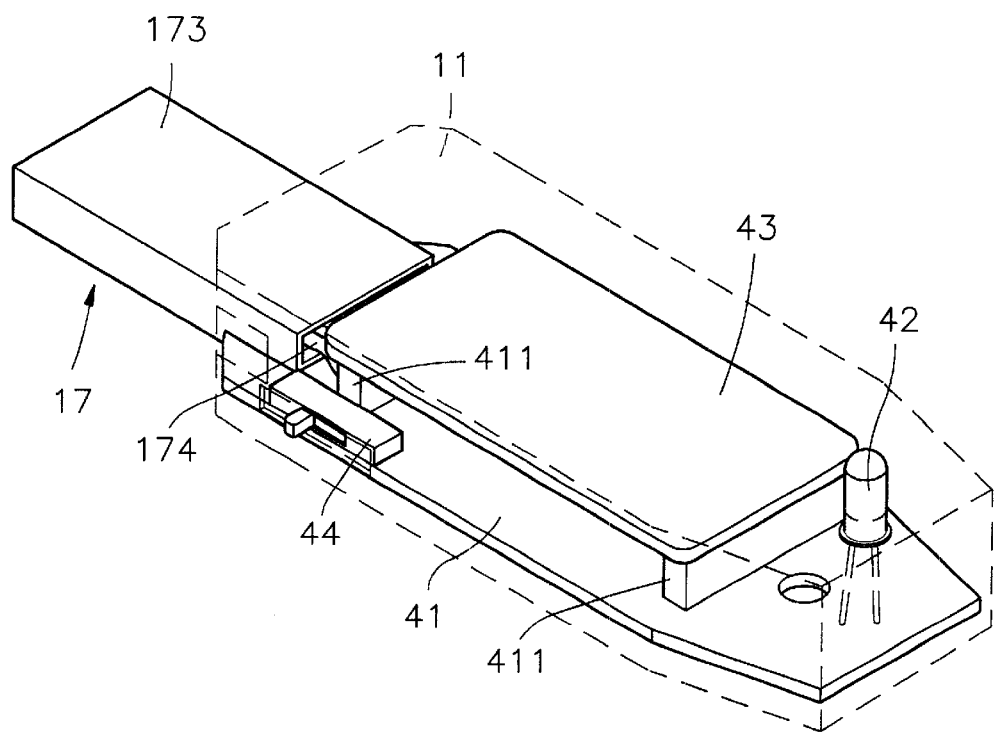
FIG. 4 is a perspective view of the portable data storage device according to the present invention.
Figure 5:
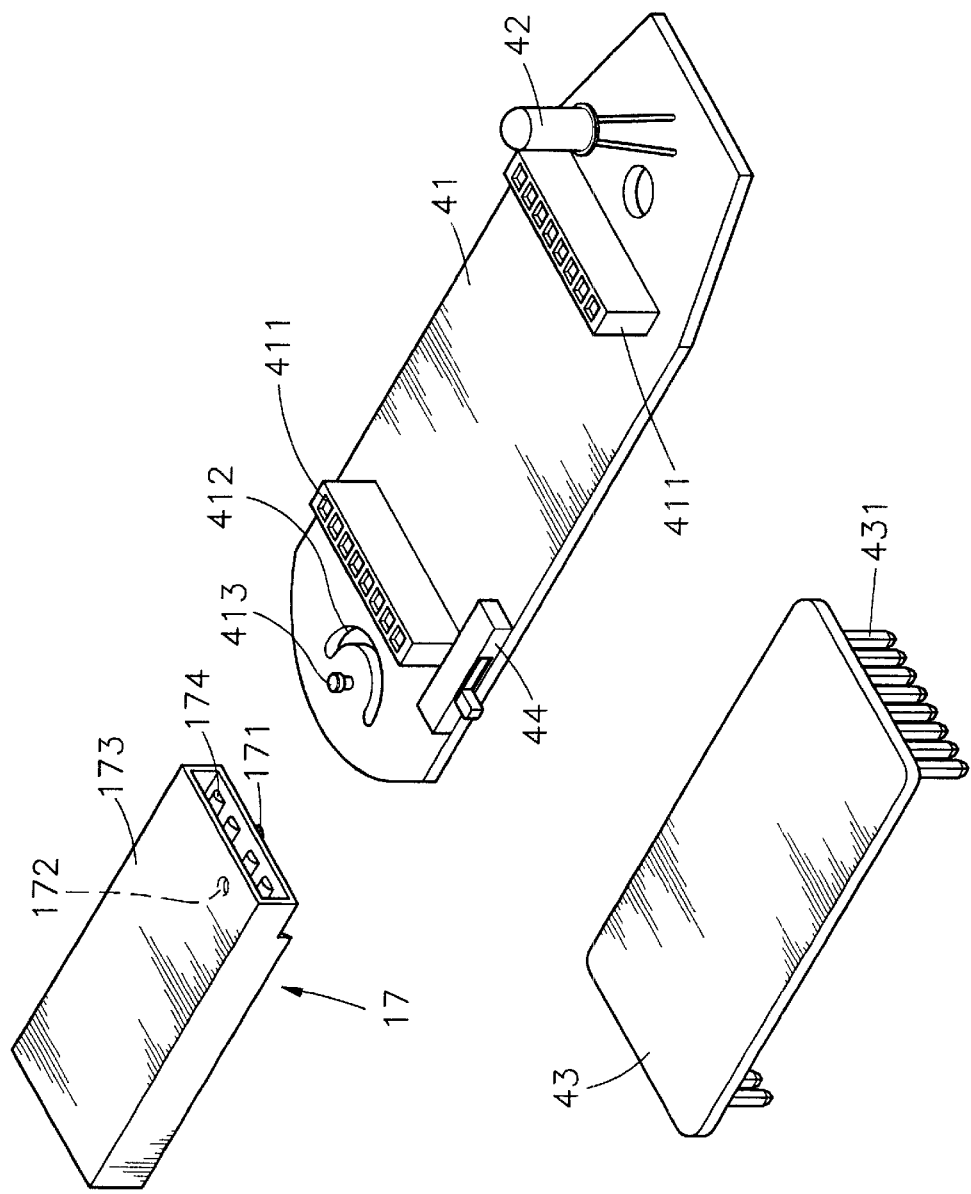
FIG. 5 is an exploded view of the portable data storage device according to the present invention.

Referring to FIGS. 4, 5, and 9 again, the main circuit board 41 comprises tow top sockets 411 adapted to receive the pins 431 of the memory circuit board 43, an indicator light 42, and a switch 44. The indicator light 42 and the switch 44 are soldered to the electric circuit of the main circuit board 41. When electrically connecting the USB port 17 to the computer 2, the indicator light 42 is turned on to give a visual signal. When switching on the switch 44, the user can operate the computer 2 to write data into the main circuit board 41 and the memory circuit board 43.

Figure 9:
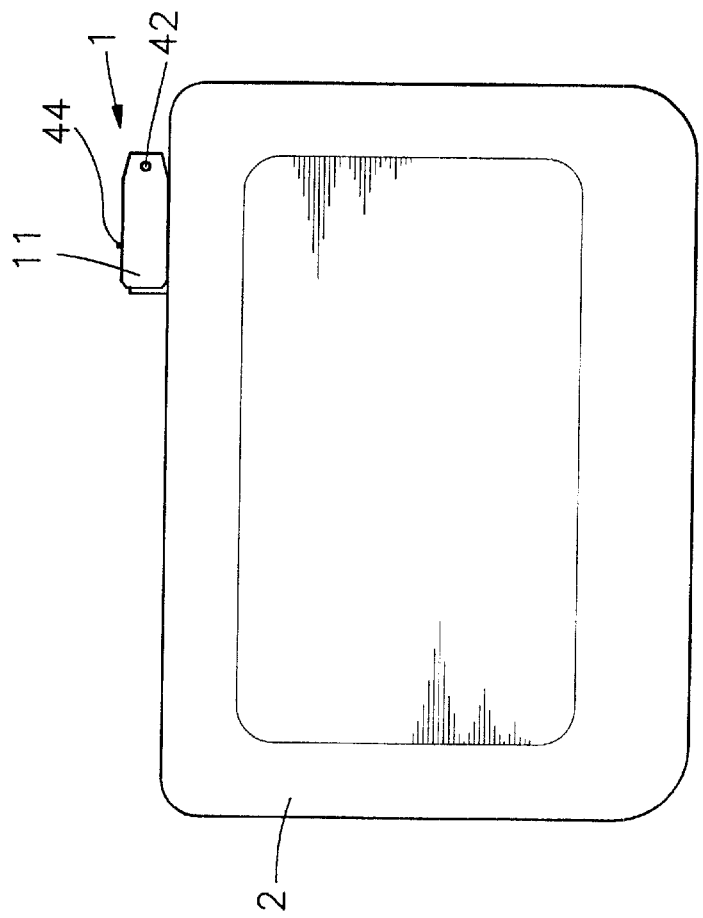
FIG. 9 is a schematic drawing showing the portable data storage device installed in the USB port of a computer.

Referring to FIG. 9 and FIG. 5 again, the serial bus port 17 of the body 1 is comprised of a housing 173 and a set of pins 174 installed in the housing 173. When inserting the serial bus port 17 into the USB port 21 of the computer 2, the pins 174 are respectively electrically connected to the respective pins of the USB port 21 of the computer 2. After installation, the serial bus port 17 can be turned 90° leftwards or 90° rightwards relative to the main circuit board 41, keeping the serial bus port 17 and the main circuit board 41 arranged at right angles, so as to minimize the protruding area of the body 1 of the portable data storage device outside the computer 2.

The aforesaid serial bus port 17 can be a USB (universal serial bus) port, or IEEE 1394 serial bus port. The turning angle of the serial bus port 17 relative to the main circuit board 41 can be set (for example, 45° or 180°) subject to the angle of the USB port 21 of the computer 2.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A portable data storage device comprising:
   a main circuit board, said main circuit board having two sockets bilaterally disposed at a top side thereof;
   at least one memory circuit board connected to said main circuit board, said at least one memory circuit board comprising a plurality of contact pins respectively plugged into said sockets of said main circuit board; and
   a serial bus port pivoted to one end of said main circuit board and turned relative to said main circuit board within a limited angle.

2. The portable data storage device as claimed in claim 1 wherein said main circuit board comprises an upright pivot rod disposed near one end thereof, and said serial bus port comprises a through hole coupled to said upright pivot rod of said main circuit board for enabling said serial bus port to be turned about said upright pivot rod within a limited angle.

3. The portable data storage device as claimed in claim 2 wherein said main circuit board comprises a smoothly curved sliding slot spaced around said upright pivot rod, and said serial bus port comprises a bottom guide rod inserted into said smoothly curved sliding slot to guide movement of said serial bus port about said upright pivot rod within said limited angle.

4. The portable data storage device as claimed in claim 1 wherein said at least one memory circuit board includes a plurality of memory circuit boards arranged in a stack.

5. The portable data storage device as claimed in claim 1 wherein said serial bus port is a universal serial bus.

6. The portable data storage device as claimed in claim 1 wherein said serial bus port is an IEEE 1394 serial bus port.

* * * * *